United States Patent [19]
Adam

[11] 4,130,890
[45] Dec. 19, 1978

[54] INTEGRATED DDC MEMORY WITH BITWISE ERASE

[75] Inventor: Fritz G. Adam, Freiburg i. Br, Germany

[73] Assignee: ITT Industries, Inc., New York, N.Y.

[21] Appl. No.: 804,685

[22] Filed: Jun. 8, 1977

[30] Foreign Application Priority Data
Jul. 10, 1976 [DE] Germany .............................. 26.31165

[51] Int. Cl.² .............................................. G11C 11/40
[52] U.S. Cl. ..................................... 365/184; 307/238
[58] Field of Search ..................... 340/173 R; 365/184; 307/238

[56] References Cited
U.S. PATENT DOCUMENTS

| | | | |
|---|---|---|---|
| 3,618,051 | 11/1971 | Oleksiak | 340/173 R |
| 3,733,591 | 5/1973 | Cricchi | 340/173 R |
| 3,971,001 | 7/1976 | Lodi | 340/173 R |

*Primary Examiner*—Stuart N. Hecker
*Attorney, Agent, or Firm*—John T. O'Halloran; Peter C. Van Der Sluys

[57] ABSTRACT

This relates to a monolithic dual-dielectric cell (DDC) memory array with a DDCFET matrix. The substrate zones of these DDCFETs are inserted into a substrate body having islands for decoder logic and potential selection integrated MISFET circuits. These circuits provide potentials to bitwise write, erase or read the matrix.

14 Claims, 13 Drawing Figures

INTEGRATED DDC MEMORY WITH BITWISE ERASE

BACKGROUND OF THE INVENTION

As described in the German technical journal "Siemens Forschungs und Entwicklungs Berichte", Vol. 4 (1975), No. 4, pp 213 to 219, memory circuits employing MNOS-transistors arranged in a matrix and permitting bitwise writing and matrixwise erase are known. These MNOS field-effect transistors with an insulated gate consisting of an $Si_3N_4$ partial layer and a silicon-oxide partial layer, are insulated-gate field-effect transistors whose threshold voltages can be shifted between two values $U_{TL}$ and $U_{TH}$ with the aid of positive and negative gate voltages. To the two threshold voltages $U_{TL}$ and $U_{TH}$ there is assigned the binary status "0" and "1", respectively.

However, insulated-gate field-effect transistors with insulated-gate sequences of different composition are known and such memories have become known as DDC memories (DDC standing for dual-dielectric-cell). Relative thereto, there should be mentioned the MAOS field-effect transistor whose gate oxide comprises one partial layer of aluminum oxide and a second partial layer of silicon oxide. In the following, however, there is used the more general designation DDC memory or DDC field-effect transistor respectively. The mode of operation is described in detail in the above-mentioned reference, and further discussion is not deemed necessary.

According to the "IEEE Journal of Solid-State Circuits" (December 1974), pp. 444 to 446, to permit the bitwise erase of such DDC storage matrices there has been developed a MNOS storage matrix whose MNOS field-effect transistors are arranged on an insulating substrate by being separated from one another on islands, with the substrate regions thereof each comprising a highly doped substrate partial region, and with the substrate partial regions thereof being connected to one another in a column-wise fashion.

In conventional DDC storage matrices, the DDC field-effect transistors are erased or written by applying a voltage of corresponding polarity between the gate and the substrate region, this voltage being sufficient to shift the threshold voltage.

The conventional DDC memory array permitting the bitwise erase, write and read of information in a matrix, however, has the disadvantage that the number of its erasewrite cycles is restricted because the "signal-to-noise ratio" is insufficiently large, i.e. that the magnitude of the gate voltages of the transistors lying in the same row or in the same column with the addressed storage transistor, during the write or erase phase is not low enough to avoid a certain write or erase effect and, consequently, an unwanted reduction of the so-called threshold voltage window.

Moreover, the conventional DDC memory has the disadvantage of being more costly in manufacturing the matrix with the necessary logic circuits on an isolation substrate. It is actually desirable to be able to fabricate such a DDC memory permitting the bitwise erase, including the necessary logic circuits, by employing the conventional planar diffusion technique, also on a semiconducting substrate.

SUMMARY OF THE INVENTION

It is an object of the invention, therefore, to provide an integrated DDC memory capable of being fabricated on a semiconducting substrate by employing the conventional planar technique, employing DDC field-effect transistors whose individual storage positions can be more frequently written and erased without affecting semi-addressed storage positions. In spite of this, however, it shall also be randomly possible to erase all the information in the matrix at once.

According to a broad aspect of the invention, there is provided a monolithically integrated dual-dielectric cell (DDC) memory array comprising: a substrate body of a first conductivity type; a first plurality of m.n DDC field-effect transistors arranged in m columns; a second plurality of m.n. DDC field-effect transistors arranged in n rows, each of said field-effect transistors having a substrate region of a second conductivity type, said substrate regions arranged in a column-like manner and associated with column addresses $X_1$ to $X_m$, a drain region within ech of said substrate regions coupled in a column-like manner, a source region within each of said substrate regions coupled columnwise as a bit line, and a gate electrode coupled in a rowlike manner as word lines and associated with row addresses $Y_1$ to $Y_n$; decoding logic; potential-selecting circuits, said decoding logic and said potential selecting circuits responsive to binary signals for assuming one of four operating modes; and at least one substrate well of said second conductivity type for accommodating said decoding logic and said potential selecting circuits.

Preferably, the integrated DDC memory according to the invention, by employing the planar diffusion process for producing the source regions and the drain regions in a semiconducting substrate, is designed in such a way that the DDC field-effect transistors of the storage matrix are inserted in a column-wise manner into each time one continuous substrate region forming a pn-junction in a substrate body, and that to each of the substrate regions for all of the employed DDC field-effect transistors of one column, there is inserted one common source region and one common drain region.

The invention offering the advantage of a safe "signal-to-noise ratio", safeguarding the more frequent trouble-free writing and erasing, of course, can also be applied to the conventional DDC memory described in the aforementioned reference "IEEE Journal of Solid-State Circuits" (December 1974), pp. 444 to 446. That is the substrate regions can be designed to have the shape of semiconductive areas on an isolation substrate body.

Preferably, the substrate regions are inserted into a substrate body by employing the planar diffusion process, or else may be produced by way of frame-shpaed isolation diffusions of a first conductivity type with the aid of an epitax layer of the other conductivity type on a substrate body of the first conductivity type. At least during the erase processes, the substrate body is brought to the potential $U_3$, and is otherwise applied to $U_0$ or to any other potential ranging between $U_0$ and $U_3$. In the case of p-channel MNOS field-effect transistors, the displacement voltage $U_3$ in n-conducting substrate regions amounts to about $-30$ V, and to about $+30$ V in the case of n-channel MNOS field effect transistors in p-conducting substrate regions.

The above and other objects of the present invention will be more clearly understood from the following detailed description taken in conjunction with the accompanying drawings, in which:

DESCRIPTION OF THE PREFERRED EMBODIMENT

Figure 1:
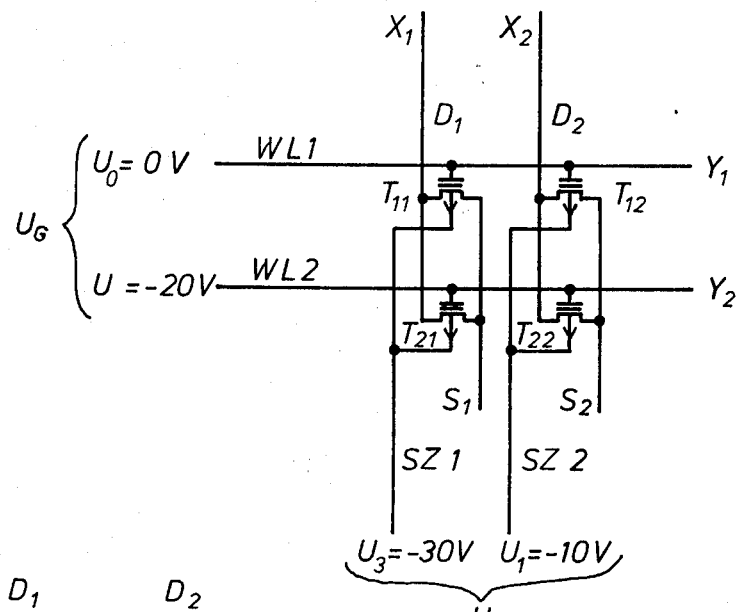
FIG. 1 shows the circuit of a matrix employing four DDC field-effect transistors.

Referring to FIG. 1, there is shown a four-bit storage matrix arrangement comprising four p-channel MNOS field-effect transistors $T_{11}$, $T_{12}$, $T_{21}$, $T_{22}$. In this circuit diagram there are used the following references: $U_G$ = word line potential, $U_Z$ = substrate region potential, WL = word line, SZ = substrate region, D = drain terminal, S = source terminal. In this FIG. 1, there are also stated potential values relating to $U_G$ and $U_Z$ which are suitable for the selective bitwise erase of the DDC field-effect transistor $T_{11}$ of the bit address $X_1$, $Y_1$.

Figure 2:
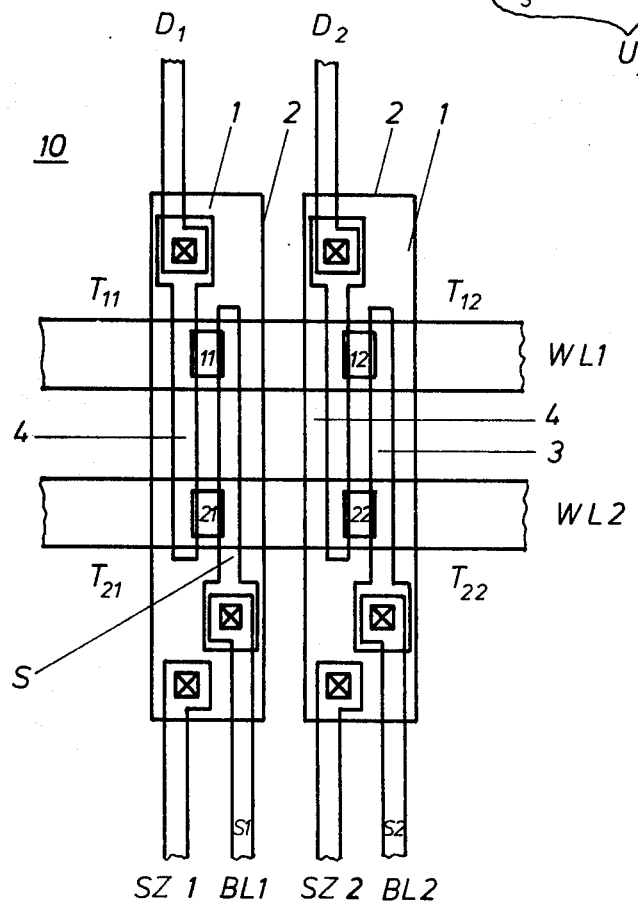
FIG. 2 shows the top view of a semiconductor wafer, realized by employing two planar substrate regions.
Figure 3:
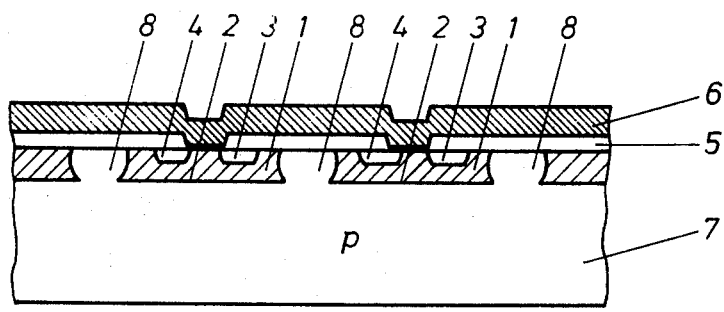
FIG. 3 is a cross sectional view taken through the substrate regions vertically in relation to the surface side of a plate-shaped substrate body.

FIG. 2, in a top view of the surface of a semiconductor wafer carrying the conductive leads, shows the monolithic integration of the storage matrix 10, the basic circuit of which is shown in FIG. 1. Into the surface side of this semiconductor wafer there are inserted two substrate regions 1 extending in the Y-direction, whose pn-junctions 2 come to the semiconductor surface. Into these substrate regions 1 there are inserted for all of the DDC field-effect transistors of one column, each time one common source region 3 and one common drain region 4. On an insulating layer 5 - as is also illustrated in FIG. 3 - and transversely in relation to the substrate regions 1, there extend the aluminum conductive leads 6 serving as the word lines WL connecting the gate electrodes of the DDC field-effect transistors in a row-wise manner to the output of an MIS word potential selecting circuit. D1 and D2 indicate the drain terminals common to all DDC field-effect transistors of one column or of one substrate region 1 while S1 and S2 indicate the source terminals common to one column, corresponding to the bit lines BL1 or BL2 respectively.

Moreover, the cross sectional view of FIG. 3 still illustrates a method of producing the substrate regions 1 by employing the well known method of epitaxial application of an epitax layer of a first conductivity type (for example of the n-conductivity type) containing the substrate regions 1, onto a substrate body 7 of the other conductivity type (p-conductor). For the column-wise separation of the substrate regions 1, insulating zones 8 of the same conductivity type as that of the substrate body 7 are diffused in the manner known per se through the epitax layer containing the substrate regions 1.

Figure 4:
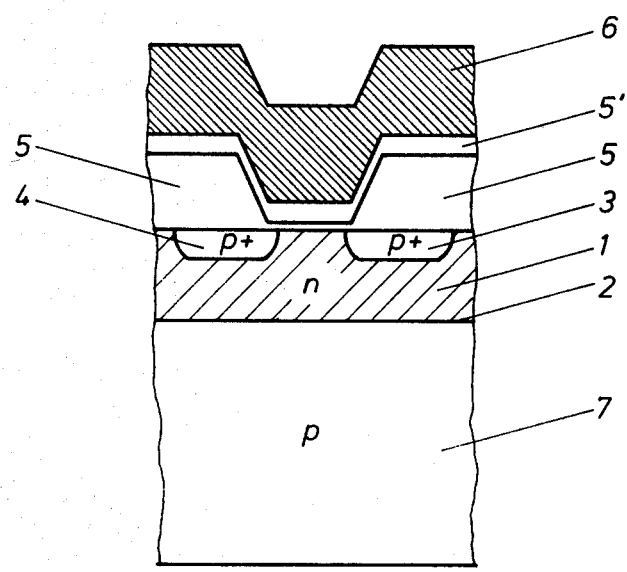
FIG. 4 shows a partial sectional view of FIG. 3.

FIG. 4 which, on an enlarged scale, shows part of a DDC field-effect transistor, illustrates that the layer 5 of insulating material consists of a silicon oxide partial layer 5 which is reduced in thickness within the gate area between the source region and the drain region, and of the silicon nitrid partial layer 5' positioned thereon. Within the gate area the layer of insulating material is subjected to a high electric field by applying corresponding potentials during the "writing" and "erasing", i.e. during the short period of the write or erase pulse, with this electric field causing the state of charge in the boundary surface area between the partial layers 5 and 5' to be changed owing to tunnel injection or tunnel electron emission.

The change of charge as produced during the "writing", and which practically remains "frozen" during normal gate voltages, such as during the "reading", requires an increased threshold voltage $U_{TH}$ which, in terms of magnitude, may range somewhere between 8 and 10 volts.

The electric field in the isolator, which drops between the gate electrode 6 and the substrate region 1, is subjected to a polarity reversal during the erase, so that the threshold voltage is now adjusted to a value $U_{TL}$ which is particularly low in terms of magnitude. This value of $U_{TL}$ may be somewhere in the range between 1 and 2 volts. The gap between the two threshold voltage values $U_{TH}$ following the writing, and $U_{TL}$ following the erase, is referred to as the threshold voltage window. Accordingly, the width of the threshold voltage window may be defined as $$U_T = U_{TH} - U_{TL}.$$

During the "read" phase, the gate voltage is adjusted to about the center of the threshold voltage window, i.e. to about the arithmetic mean value of $U_{TH}$ and $U_{TL}$:

$$U_G = U_R \approx \tfrac{1}{2}(U_{TH} + U_{TL}).$$

Figure 5:
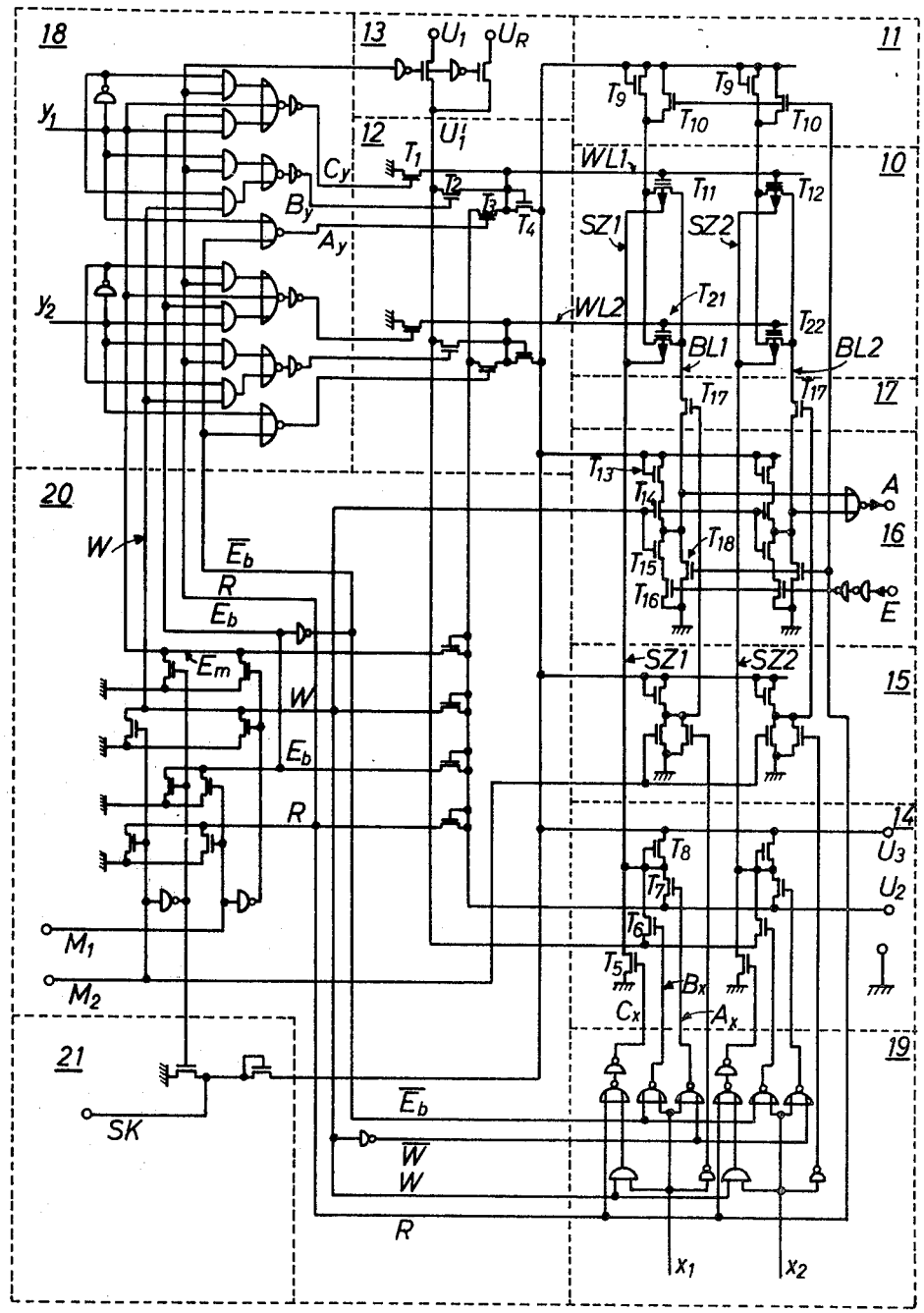
FIGS. 5 to 8 show circuit diagrams relating to four preferred embodiments of a fully decoded four-bit DDC memory according to the invention (versions A, A', B and C)

FIG. 5, with the exception of the address decoding, shows the total circuit of a version A of a DDC memory according to the invention with reference to the example of a four-bit storage matrix. The circuit is divided functionally with the aid of dashlines, into twelve boxes numbered 10 to 21. All circuit parts lying outside the storage matrix as accommodated in box 10, are accommodated in one or more separate substrate wells.

The box No. 10 shows the four-bit storage matrix comprising the four DDC memory transistors. The common drain line DL of each column respectively extends via two parallel-connected load transistors in box No. 11, to the highest operating potential $U_3$. Each time one of the transistors T9 as connected parallel in pairs, in box No. 11, is highly resistive and has its gate electrode likewise applied to $U_3$.

To other transistor (T10) is low-ohmic and only rendered conductive during "reading", i.e. during the read pulses via the control signal line R by means of the read voltage $U_R$, in order to accelerate the read-out.

The source electrodes of the DDC transistors of each column form the respective column bit line BL. This bit line BL, is coupled each time via one switching transistor T17 in box No. 17 acting as a forward gate to box No. 16 in which the gates are arranged for writing-in (transistors T13 to T16) and readout (transistor T18) of the data over the bit line. The forward gate in box No. 17 is only switched to the conducting state when the respective column $X_i$ is addressed, and when simultaneously there has been given the instruction "read" or "write". In all other cases the bit line remains floating. The connection of these three conditions for the switching-on of the forward gate in box No. 17 is effected with the aid of the NOR gates in box No. 15.

The input variables of the NOR gate of the addressed column $X_i$ and $\overline{X}_i$ and $M_2$. Owing to the decoding of the mode-of-operation code signals $M_1$ and $M_2$ by the decoding circuit in box No. 20, still to be referred to in detail hereinafter, the following logic relationship applies:

$$\overline{M}_2 = R + W,$$

with the righthand term $R + W$ indicating either "read" or "write". Therefore, each NOR gate in box No. 15 realizes the following logical relationships:

$$F = \overline{\overline{X}_i + \overline{M}_2} = X_i M_2 = X_i (R + W).$$

The third metallic connection belonging to each matrix column to the outer circuit is the connection extending from the respective column substrate region SZ to the associated potential selecting circuit in box No. 14.

Correspondingly, the DDC transistor gate electrodes are connected in a row-wise manner via the word lines WL to the respective associated potential selecting circuits in box No. 12.

The potential selecting circuits for the word lines (WL) in box No. 12 comprising the transistors T1 to T4, and for the substrate regions (SZ) in box No. 14 comprising the transistors T5 to T8 are identical in version A (FIG. 5), version A' (FIG. 6), and in version B (FIG. 7), and in dependence upon the three logic input signals $A_y$, $B_y$ and $C_y$ or $A_x$, $B_x$ and $C_x$ randomly connect one of the four potentials $U_3$, $U_2$, $U_1'$ or $U_0$ to the corresponding output W1 or SZ, respectively.

Figure 9:
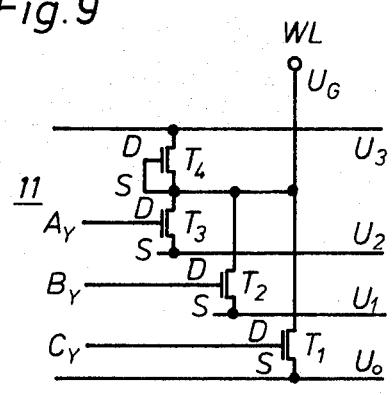
FIG. 9, as a section of FIGS. 5 to 8, shows one individual potential selecting circuit for four different potentials.

One single potential selecting circuit of this kind is shown in FIG. 9, with the designations applying to the case of the word lines. The output potential $U_G$ is taken off at the output WL at the interconnected drain terminals D of three insulated-gate field-effect transistors of the enhancement type $T_1$, $T_2$ and $T_3$. The associated source terminals S are applied to the potentials $U_0$, $U_1'$ or $U_2$ respectively. The potential $U_3$, however, via a further insulated-gate field-effect transistor $T_4$ of the depletion type whose source electrode together with its gate electrode, is connected to the interconnected drain terminals of the insulated-gate field-effect transistors $T_1$, $T_2$ and $T_3$. The first input signal $A_x$ or $A_y$ is applied to the gate electrode of the third insulated-gate field-effect transistor $T_3$, the second input signal $B_x$ or $B_y$ is applied to the gate electrode of the second insulated-gate field-effect transistor $T_2$, and the third input signal $C_x$ or $C_y$ is applied to the gate electrode of the first insulated-gate field-effect transistor $T_1$ respectively.

The assignment of the input signals to the output potential may be taken from Table 1 (p. 13). The potential $U_1'$, with the aid of the circuit in box No. 13 of FIG. 5, is always switched to the read potential $U_R$ when the mode of operation "read" (R=1) is switched on, but otherwise, (i.e. with respect to R=0) always remains switched to $U_1$. According to the invention, the following relations exist between the potentials:

$$U_1 - U_0 = \tfrac{1}{3} \cdot (U_3 - U_0)$$

$$U_2 - U_0 = \tfrac{2}{3} \cdot (U_3 - U_0) \qquad (1)$$

$$/U_R - U_0/ \leq /U_1 - U_0/$$

Table 1

| $A_y$ or $A_x$ | $B_y$ or $B_x$ | $C_y$ or $C_x$ | $U_G$ to WL or $U_Z$ to SZ |
|---|---|---|---|
| 0 | 0 | 0 | $U_3$ |
| 1 | 0 | 0 | $U_2$ |
| 0 | 1 | 0 | $U'_1$ |
| 0 | 0 | 1 | $U_o$ |

The inputs $A_y$, $B_y$ and $C_y$ of each individual potential selecting circuit in box No. 12 belonging to one word line, are simultaneously the outputs of the respective associated word logic circuit in box No. 18 of FIG. 5. As input signals to the word logic circuits there are considered, on one hand, the Y-address signals (here $Y_1$ and $Y_2$) as supplied by an address decoding circuit of the type assumed to be known, and which is not explained herein and, on the other hand, certain control signals supplied by the mode-of-operation decoding circuit in box No. 20 and which, depending on the chosen mode of operation, safeguard the proper potential supply of the addressed word line as well as that of the non-addressed word lines.

The operating mode decoding circuit in box No. 20 of FIG. 5 produces from the two binary input code signals $M_1$ and $M_2$ in the manner known per se, four binary control signals which, depending on the selection of $M_1$ and $M_2$, will appear at one of the four outputs R, $E_b$, W or $E_m$, thus being determinative of the operating mode of the DDC memory. The assignment of the input code signals $M_1$ and $M_2$ to the output signals R, $E_b$, W and $E_m$ may be taken from Table 2 below. In this table, R stands for "to read an information out of a storage location" or briefly "read", $E_b$ stands for "to erase as information in a storage location" or briefly "bitwise erase", W stands for "to write an information into a storage location" or briefly "write", and $E_m$ stands for "erase the information of all storage locations of the storage matrix simultaneously" or briefly "matrix-wise erase".

Table 2

| $M_1$ | $M_2$ | R | $E_b$ | W | $E_m$ |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

The contents of Table 2 and, consequently, the function of the operating mode decoding circuit in box No. 20 of FIG. 2 may also be expressed by the following four Boolean relationships:

$$R = \overline{M}_1 \overline{M}_2 = \overline{M_1 + M_2} \qquad (2a)$$

$$E_b = \overline{M}_1 M_2 = \overline{\overline{M}_1 + M_2} \qquad (2b)$$

$$W = \overline{\overline{M}_1 M_2} = \overline{\overline{M}_1 + M_2} \qquad (2c)$$

$$E_m = M_1 M_2 = \overline{\overline{M}_1 + \overline{M}_2} \qquad (2d)$$

Apart from the four outputs R, $E_b$, W and $E_m$ the decoding circuit in box No. 20 of FIG. 5 comprises two further outputs for the inverted control signals $\overline{E}_b$ and $\overline{W}$.

Of these six output signals five are used as the input signals for the word logic circuits in Box No. 18 of FIG. 5, namely the signals R, $E_b$, W, $E_m$ and $\overline{E}_b$.

The four output signals R, W, $\overline{W}$ and $\overline{E}_b$ are applied as input signals to the column logic circuits in box No. 19 of FIG. 5. Together with the X-address, the circuits in box No. 19 effect the proper potential supply of the addressed substrate region (regions) as well as of the non-addressed substrate regions in accordance with the operating mode R, $E_b$, W or $E_m$ as selected with the aid of $M_1$ and $M_2$.

The invention proceeds from the basic idea of determining the operating state of the memory by respectively selecting the two binary code signals $M_1$ and $M_2$ for effecting the setting to one of the four operating modes, i.e. read (R), bitwise erase ($E_b$), write (W) or matrix-wise erase ($E_m$), as well as by selecting two binary storage position (location) addresses $X_i$, $Y_k$, in which case, with respect to version A in the word lines and in the substrate regions, there are realized the potentials as shown in Table 3A, and assuming the relationships (1) exist between the potentials.

Table 3A

| | Addresses | Matrix Leads | Operating Mode | $U_G$ | $U_Z$ |
|---|---|---|---|---|---|
| Addressed Storage Position (Location) | $X_i = 1$ $Y_1 = 1$ | $SZ_j$ for $U_Z$ $WL_k$ for $U_G$ | R $E_b$ W $E_m$ | $U_R$ $U_o$ $U_3$ $U_o$ | $U_o$ $U_3$ $U_o$ $U_3$ |
| Non-Addressed Storage Position (Location) | $X_j = \overline{X}_i = 0$ $Y_1 = \overline{Y}_k = 0$ | $SZ_j$ for $U_Z$ $WL_l$ for $U_G$ | R $E_b$ W $E_m$ | $U_o$ $U_2$ $U_1$ $U_o$ | $U_o$ $U_1$ $U_2$ $U_3$ |

In this way, during write and erase, between the gate and the substrate region of all semi-addressed storage transistors arranged in the same row i or in the same column k as the addressed storage transistor (i, k), only one third of the full writing or erasing voltage $U_3$ will drop off, whereas at all of the remaining non-addressed storage transistors likewise only one third of this voltage will drop off, but with an opposite sign and, consequently, with an inverted field direction in the gate isolator.

In the p-channel technique described by way of example herein, all potentials ($U_3$, $U_2$, $U_1$ and $U_R$) must be chosen to be negative with respect to $U_0$, while the n-channel technique requires them to be positive with respect to $U_0$.

It is seen from Table 3A that during the erase instructions $E_b$ and $E_m$ the addressed substrate regions SZ are at a potential which is "raised" with respect to $U_0$, namely are at $U_3$, i.e. in the p-channel technique they are more negative than $U_0$ and, in the n-channel technique, more positive than $U_0$.

During the erase instructions $E_b$ and $E_m$, this would lead to a flux stressing of the pn-junction between the one (or more) addressed substrate region (regions) SZ on the one hand, and the substrate body SK (see 7 in FIGS. 3 and 4) on the other hand, if this substrate body SK, during the erase instructions, were to be applied to $U_0$ or to any other potential ranging between $U_0$ and $U_3$. Correspondingly the same also applies to the non-addressed substrate regions which e.g. during the writing (W) are switched to $U_2$. In order to avoid such a flux stressing with all the detrimental consequences with respect to the operation of the integrated circuit due to carrier injections, care is taken by circuit design steps and measures that the substrate body, at least during the erase instructions, is switched to the same potential $U_3$ which, in the case of $E_b$, is applied to the addressed substrate region and, in the case of $E_m$, to all substrate regions.

In FIG. 5, the corresponding circuit design measure is shown to have been taken by providing the inverter in box No. 21, whose load transistor is designed as a depletion type insulated-gate field-effect transistor whose drain terminal is applied to potential $U_3$ and whose gate electrode is connected to the source side of the transistor. This point which is also connected to the drain side of the associated switching transistor, is the output of the inverter and, e.g. with the aid of a diffusion region of the same conductivity type as the source and drain regions extending down to the substrate body SK, is conductively connected to the substrate body. The input of the inverter, i.e. the gate electrode of the switching transistor, is connected to the control signal $\overline{M}_2 = \overline{E}_b + \overline{E}_m$. The switching transistor is so dimensioned that in the switched-on state, the potential $U_2$ is applied to the output of the inverter and, consequently, to the substrate body SK.

More simply and due to the reduction of switching times, the substrate body may be permanently connected to the fixed potential $U_3$, putting up with the corresponding permanent blocking load of the pn-junctions to the substrate regions outside the erase times.

In order to realize the assignment of the potentials $U_G$ and $U_Z$ to the addressed and non-addressed storage positions (locations) in the various operating states, as required in Table 3A, the address signals and the operating mode signals for each line and for each column of the matrix are logically combined in a suitable way. With respect to the rows, this object is achieved by the word logic circuits in box No. 18, and with respect to the columns by the column logic circuits in box No. 19 of FIG. 5.

Each individual one of the word logic circuits comprises three outputs $A_y$, $B_y$ and $C_y$ which, according to the invention, obey the following logical (Boolean) relations:

$$A_y = \overline{Y + \overline{\overline{E}}_b} \tag{3a}$$

$$B_y = YR + \overline{Y}W \tag{3b}$$

$$C_y = \overline{Y}R + YE_b + E_m \tag{3c}$$

Each individual column logic circuit comprises three outputs $A_x$, $B_x$ and $C_x$ which, according to the invention, satisfy the following relations:

$$A_x = \overline{X + \overline{W}} \tag{4a}$$

$$B_x = \overline{X + \overline{E}_b} \tag{4b}$$

$$C_x = XW + R \tag{4c}$$

The relations 3a to 4c are realized by the logical connectives as shown in boxes 18 and 19 of FIG. 5.

The circuits in boxes 18 and 19 can be simplified when converting the relations 3b, 3c and 4c into suitable NOR connectives.

The requirements of Table 3A are satisfied by the following relations which are equivalent to the relations 3a to 4c:

$$A_y = \overline{Y + \overline{\overline{E}}_b} \tag{5a}$$

$$B_y = \overline{Y\overline{R} + \overline{YW} + M_2} = \overline{YM_1 + \overline{YM_1} + M_2} \quad (5b)$$

$$C_y = \overline{YM_2 + W + A_y} \quad (5c)$$

and:

$$A_x = \overline{x + \overline{W}} \quad (6a)$$

$$B_x = \overline{X + \overline{E_b}} \quad (6b)$$

$$C_x = \overline{\overline{X}M_1 + M_2} \quad (6c)$$

Figure 6:
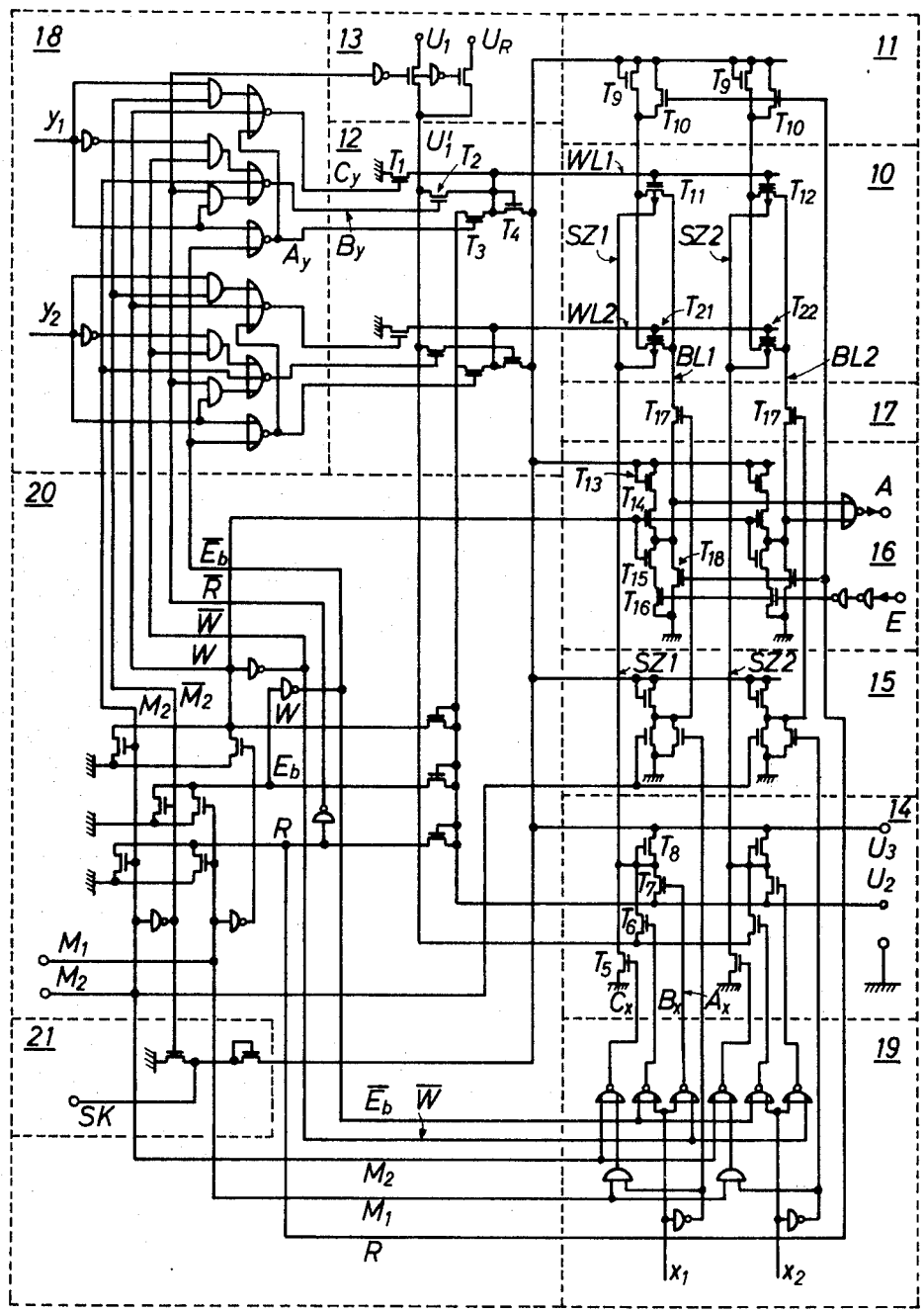

It appears that the circuit version A' in FIG. 6 corresponds to these relations. Besides the simplifications of the word logic circuits in box No. 18 owing to the omission of each time one AND-combination and two inverter stages, and besides the simplifications in the column logic circuits in box No. 19 owing to the omission of each time one inverter stage, there will now also result a simplification in the operating mode decoding circuit in box No. 20. Considering that the signal $E_m$ does not occur in the relations (5a) to (6c), it no longer needs to be realized in the decoding circuit in box No. 20, which will thus result in the saving of three transistors.

"Write" always means the writing of a logical "1" into the respective storage position (location) and it is realized, as already mentioned hereinbefore, by producing an increased threshold voltage $U_{TH}$ in the corresponding DDC storage transistor with the aid of the control signal W.

In distinction thereto, the "writing" of a logical "0" into one individual storage position is always effected with the aid of the erase instruction $E_b$ and with the aid of the corresponding storage address by producing the lower threshold voltage $U_{TL}$ in the respective storage transistor. The simultaneous "writing" of the logical "0" into all of the storage positions (locations) of the matrix may be effected by the instruction $E_m$.

During the "read-out" the addressed storage transistor, by actuating the transistors T10, T17 and T18 as arranged in series therewith, operates as a source follower. During this operation, the transistor T18 acts as a load transistor. The NOR gate at the data output A supplies a logic "1" when the addressed storage transistor, owing to a high threshold voltage $U_{TH}$ when acted upon by $U_R$, is rendered non-conductive over the word line. This results because all of the other inputs of the NOR gate are applied to "0", since the non-addressed forward gates T17 are blocked. Likewise blocked are the remaining transistors of the addressed column because their word lines are applied to $U_0$. If, however, an "0" occurs in the addressed storage transistor, i.e. when it has the full threshold voltage $U_{TL}$, it is rendered conductive during the "read-out", the magnitude of the potential at the source follower output is increased, and an "0" will appear at the NOR gate output A.

Figure 7:
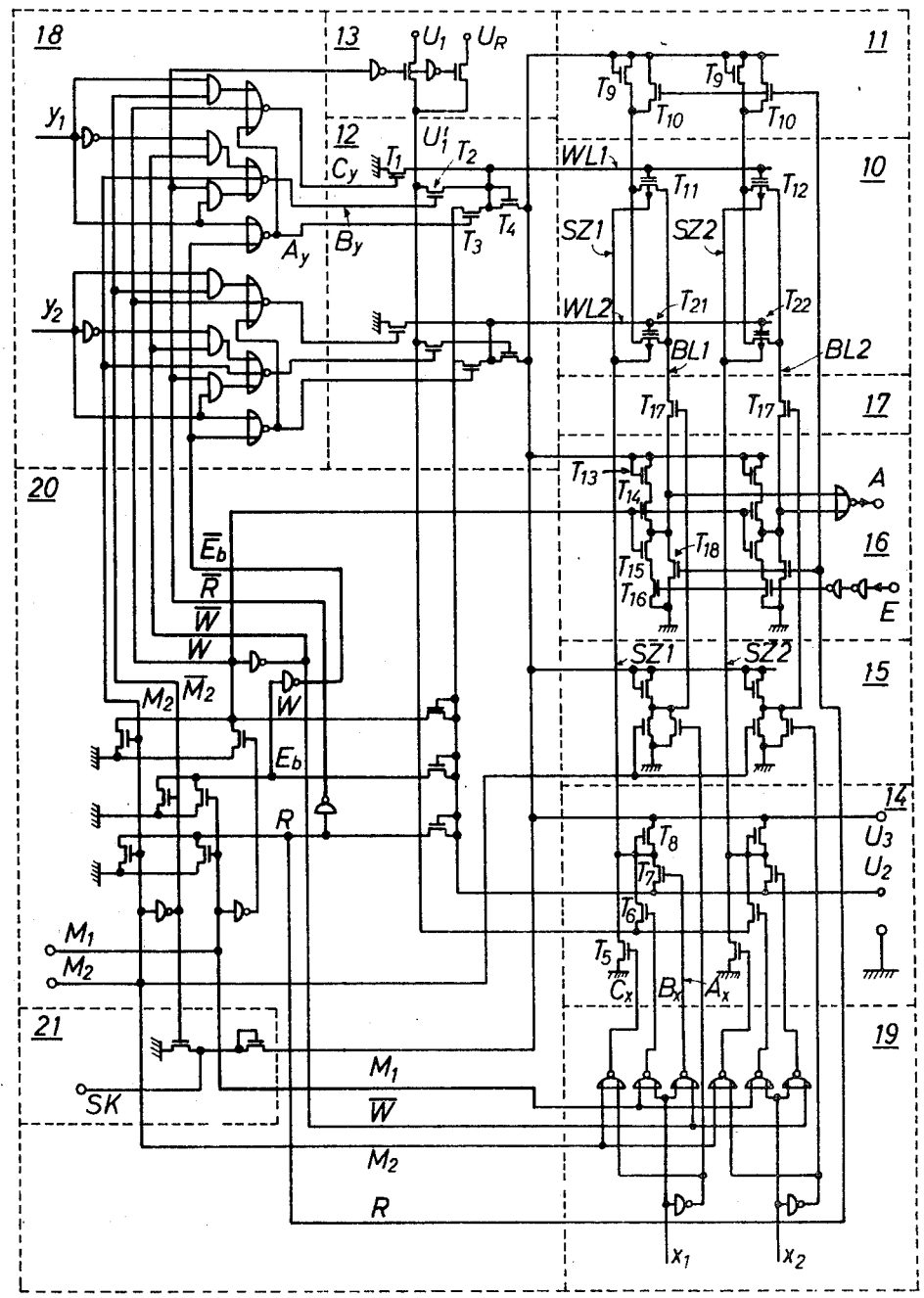

The column logic circuits in box No. 19 of FIG. 5 can be further simplified in terms of saving surface area by connecting during the "read-out", the substrate regions of the non-addressed columns to the potential $U_R$ instead of to $U_0$. From this there will result the circuit of version B as shown in FIG. 7, with the potential assignment thereof being illustrative in Table 3B. The three outputs of the column logic circuit according to box No. 19 must in this case, according to the invention, satisfy the relations:

$$A_x = \overline{X + \overline{W}} \quad (7a)$$

$$B_x = \overline{X + M_1} \quad (7b)$$

and $$C_x = \overline{\overline{X} + M_2} \quad (7c)$$

Compared to version A', one AND gate may be omitted per matrix column. Moreover, the number of input signals as coming from the operating mode decoding circuit (box No. 20) is reduced from four ($\overline{W}$, $\overline{E_b}$, $M_1$ and $M_2$) to three ($\overline{W}$, $M_1$ and $M_2$).

Table 3B

| | Addresses | Matrix Leads | Operating Mode | $U_G$ | $U_Z$ |
|---|---|---|---|---|---|
| Addressed Storage Position (Location) | $X_i = 1$ $Y_k = 1$ | SZi for $U_Z$ WL$_k$ for $U_G$ | R $E_b$ W $E_m$ | $U_R$ $U_o$ $U_3$ $U_o$ | $U_o$ $U_3$ $U_o$ $U_3$ |
| Non-Addressed Storage Position (Location) | $X_j = \overline{X}_i = 0$ $Y_l = \overline{Y}_k = 0$ | SZj for $U_Z$ WL$_l$ for $U_G$ | R $E_b$ W $E_m$ | $U_o$ $U_2$ $U_1$ $U_O$ | $U_R$ $U_1$ $U_2$ $U_3$ |

For reading the data out of the memory, the storage transistors may also be employed as source followers instead of as inverter transistors. Instead of coupling the data out of the bit lines BL with the aid of a NOR gate, they will then have to be coupled out of the drain lines DL with the aid of an AND gate. For this purpose, the transistors T10 in box No. 11 now acting as load transistors, must be designed to be more resistive. Under certain circumstances it will then also be possible to do without the transistors T10 and without them being acted upon by the read signal R, provided that transistors T9 are suitably dimensioned.

During the "erase" (instructions $E_b$ and $E_m$) the field in the gate isolator 5 is always directed in such a way as to induce an accumulation layer of the majority charge carriers of the substrate region on the semiconductor surface. In this way, the full voltage $U_0 - U_3$ will drop off between the gate electrode, i.e. between the word line, and the addressed substrate region. Also all remaining voltage differences between the word line WL and the substrate regions SZ in response to the erase instruction $E_b$, calculated from the Tables 3A or 3B drop off fully at the gate isolator.

Conditions at the semiconductor surface, however, are different during the "writing". Here, the electric field of the gate isolator, at a steep writing pulse edge, induces in the first moment a deep depletion space-charge layer in the semiconductor into which minority charge carriers flow very rapidly from the source region towards the drain region forming a thin conductive inversion channel directly on the semiconductor surface. At the same time, for the sake of maintaining the charge in the surface, the depletion layer shrinks to a certain minimum thickness.

In the course of this, the channel of the storage transistor is supplied with the potential $U_0 = 0$ via the source electrode and the bit line from the output of the associated inverter in box No. 16 of FIGS. 5 to 7 which is activated during the "writing" owing to the switching on of the transistors T15 and T16, thus being switched via the data input by a "1" at the gate of T16 to "0".

If now the source side is floating as is the case with the transistors of all non-addressed bit lines owing to the blocked forward gates T17 in box No. 17 of FIGS. 5 to 7, there will, besides the tendency of setting up the inversion channel with a certain time constant, also be the opposite tendency of removing the channel, because the latter already starts at the origination, i.e. of removing charge carriers from the source region to the drain region, thus shifting the source potential $U_s$ in direction towards the drain and the gate potential. As soon as the potential of the floating source side has reached the value $U_G$-$U_T$, this channel is pinched-off and causes the transistor to be rendered non-conductive. Since the storage transistors, during the "write" operation, according to FIGS. 5 to 7, are arranged in series with the load transistors T9 whose threshold voltage has a mean value $U_{TO}$ with $$U_{TL} < U_{TO} < U_{TH},$$

and whose gate electrode is applied to the write potential $U_3$, the source potential $U_s$ of the not fully addressed transistors will adjust itself along the addressed word lines to the respective smaller one of the two values $$U_3 - U_{TO} \text{ or } U_3 - U_{T-DDC}$$

with $$U_{T-DDC} = \begin{cases} U_{TL} \text{ at a stored "0"} \\ \text{or} \\ U_{TH} \text{ at a stored "1"}. \end{cases}$$

With regard to transistors with a stored logic "0", this means that both the source and the drain potential are adjusted practically to the same value $$U_s = U_D = U_3 - T_{TO}.$$

In comparison, the source potential of transistors with a stored logic "1" is adjusted to $$U_s = U_3 - U_{TH}$$

Therefore, in these two cases, the maximum voltage dropping off at the end of the write pulse, across the gate isolator, is $$U_{GS} = \begin{cases} U_{TO} \text{ at a stored "0"} \\ U_{TH} \text{ at a stored "1"}, \end{cases}$$

that is, a maximum of about 10V. This voltage is by far insufficient for performing the write operation. Therefore, all those transistors of the addressed word lines whose bit line is not addressed and whose source side is floating owing to the blocked forward gates, with the entire bit line, are not being acted upon by the write pulse.

Since this is applicable independently of the potential of the substrate region, i.e. also when the non-addressed substrate regions are applied to $U_0$, it is possible during the "write" operation to do without the potentials $U_1$ and $U_2$ for both the non-addressed word lines and substrate regions.

Figure 8:
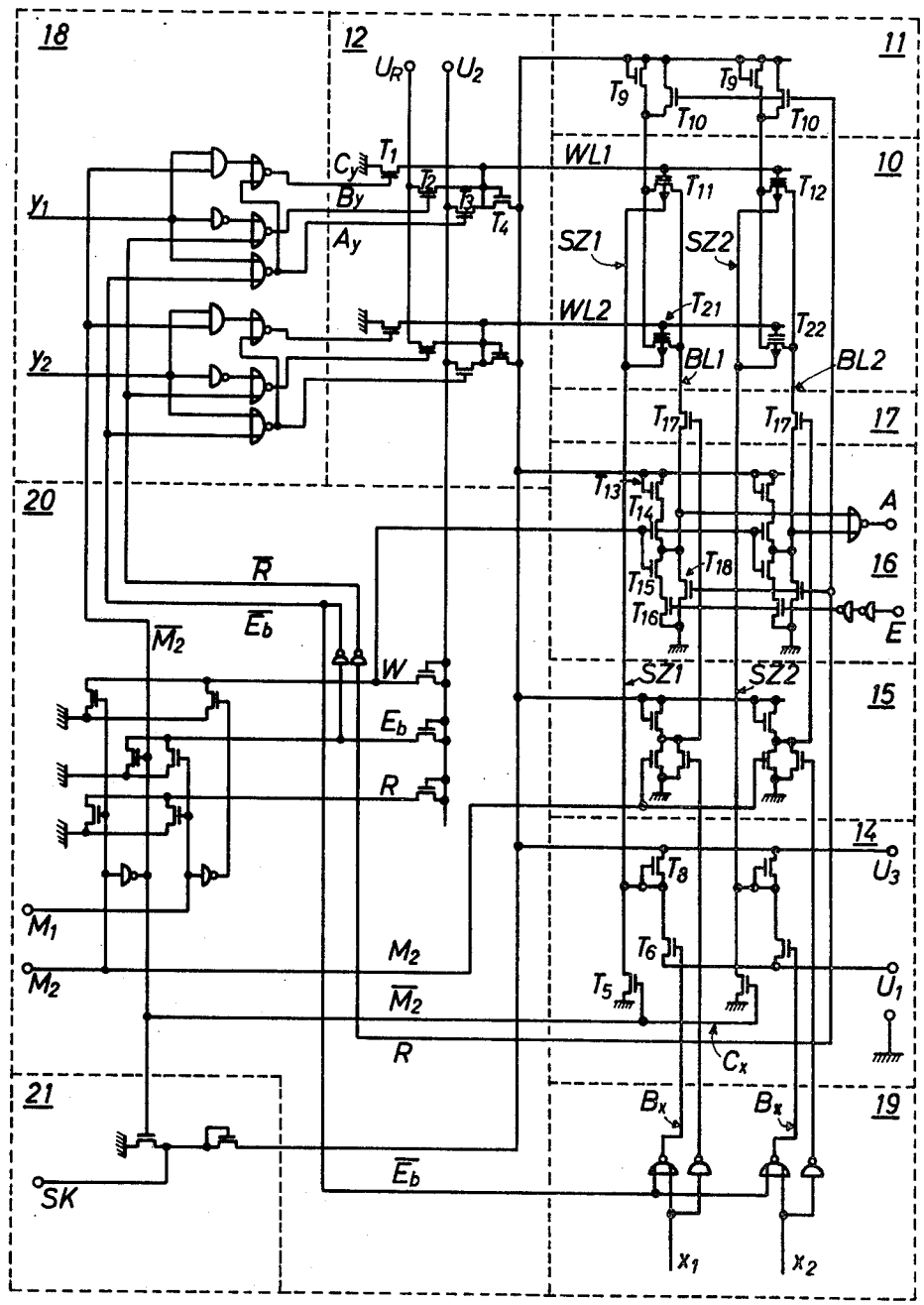
Figure 11:
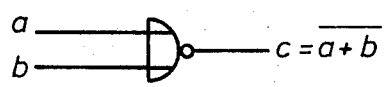
FIG. 11 refers to the realization, in the manner known per se, of an MOS-NOR gate.
Figure 11:
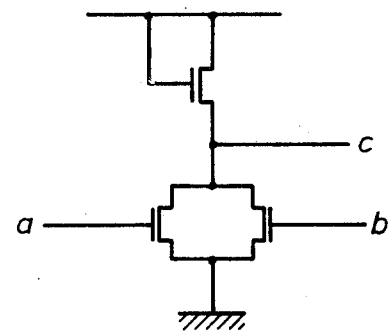
Figure 12:
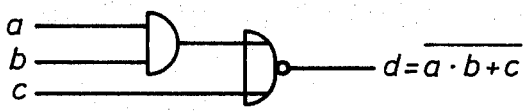
FIGS. 12 and 13 show the corresponding realization of AND/NOR combinations as occurring in word logic circuits and in the column logic circuits of FIGS. 5 to 8.
Figure 12:
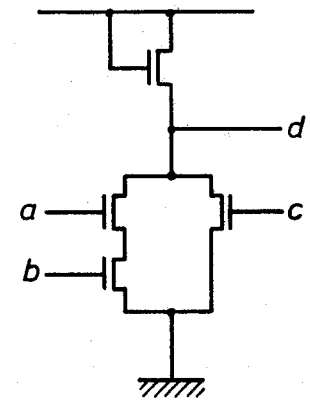
Figure 13:
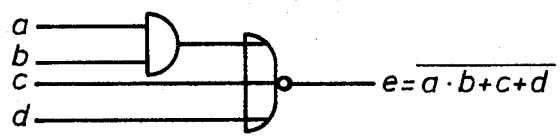
Figure 13:
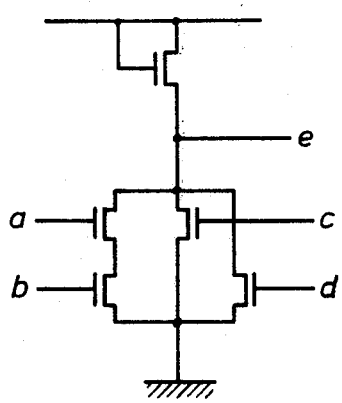

As a further embodiment of the invention there will result from this consideration, the particularly preferred version C of the DDC memory circuit as shown in FIG. 8.

Figure 10:
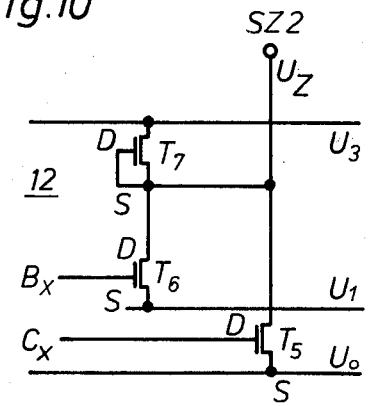
FIG. 10, as a section of FIG. 7, shows one individual potential selecting circuit for three potentials.

With respect to the assignment of the potentials, reference is now made to Table 3C. As will be recognized from the last column in this table referring to the substratewell potential $U_Z$, the level $U_2$ is now no longer required for this potential. In this way, by simultaneously saving surface space, the individual potential selecting circuit for a substrate region (box No. 14) is simplified and results in the circuit shown in FIG. 10. This circuit contains one transistor and one input less than the circuit shown in FIG. 9. The latter, however, also in Version C, is used now as before for selecting the potentials $U_G$ for the word lines in box No. 12. Moreover, the circuit is simplified in Version C by omitting the circuit portions shown in box No. 13.

Furthermore, in the circuit diagrams shown in FIGS. 5 to 8, the data are fed in at E and read out at A.

Since $U_z$ no longer occurs in column $U_Z$ of Table 3C, the inverter in box No. 21 of FIG. 8 may be laid out in such a way that in the case of a switched-on switching transistor there will appear the potential $U_0$ (instead of $U_2$) at the inverter output and, consequently, at the substrate body SK, thus resulting in a reduction of the power loss and in a corresponding switching time. Of course, in this version C, the substrate body may be firmly applied to $U_3$, and the inverter may be completely omitted in box No. 21.

TABLE 3C

| | Address | Matrix Leads | Operating Mode | $U_G$ | $U_Z$ |
|---|---|---|---|---|---|
| Addressed Storage Position (Location) | $X_i = 1$ | SZi for $U_Z$ | R | $U_R$ | $U_o$ |
| | $Y_k = 1$ | $WL_k$ for $U_G$ | $E_b$ | $U_o$ | $U_3$ |
| | | | W | $U_3$ | $U_o$ |
| | | | $E_m$ | $U_o$ | $U_3$ |
| Non-Addressed Storage Position (Location) | $X_j = X_i = 0$ | $SZ_j$ for $U_Z$ | R | $U_o$ | $U_o$ |
| | $Y_l = Y_k = 0$ | $WL_l$ for $U_G$ | $E_b$ | $U_2$ | $U_1$ |
| | | | W | $U_o$ | $U_o$ |
| | | | $E_m$ | $U_o$ | $U_o$ |

Further simplifications leading to considerable savings in surface space will result from the word and column logic circuits shown in boxes Nos. 18 and 19. In this case, the Boolean relations which the output signals of the two circuits now have to satisfy in order to meet the requirements of Table 3C can be realized by simpler NOR gate combinations than the relations (3) to (7) which are determinative of the versions A, A' and B.

According to a further embodiment of the invention, the following now applies to the three outputs of the word logic circuits in box No. 18 of FIG. 8, which simultaneously are the inputs of the potential selecting circuits of the word lines:

$$A_y = \overline{Y + \overline{E}_b} \quad (8a)$$

$$B_y = \overline{\overline{Y} + \overline{R}} \quad (8b)$$

and $$C_y = \overline{Y\overline{M}_2 + A_y} \quad (8c)$$

In box No. 14 of FIG. 8 the potential selecting circuits for the substrate regions, each only still have two inputs $B_x$ and $C_x$ which have to comply with the following relations:

$$B_x = \overline{x + \overline{E}_b} \quad (9a)$$

$$C_x = \overline{M}_2. \quad (9b)$$

Since the input $C_x$ according to (9b) contains no address information, this signal can be obtained directly from the operating mode decoding circuit (box No. 20) after its respective input signal $M_2$ has been inverted.

Accordingly, the individual column logic circuit of Version C in box No. 19 of FIG. 8 is thus reduced, as far as it is involved in the supply of the substrate regions, to one single NOR gate comprising the output $B_x$ and the inputs X and $\overline{E}_b$ according to (9a). Box No. 19, moreover, still comprises one inverter per matrix column, which is aimed at supplying the inverted address signal $\overline{X}$ for the NOR gates in box No. 15.

What is claimed is:

1. A monolithically integrated dual-dielectric cell (DDC) memory array, comprising:
    a substrate body of a first conductivity type;
    a plurality of m.n. DDC field-effect transistors arranged in m columns and n rows, each of said field-effect transistors having a substrate region of a second conductivity type formed in the substrate body, the substrate regions of transistors in a column being connected together and associated with column addresses $X_1$ to $X_m$, a drain region formed within each of said substrate regions, said drain regions of transistors in a column being connected together, a source region within each of said substrate regions, said source regions of transistors in a column being connected together as a bit line, and a gate electrode, said gate electrodes of transistors in a row being connected together as word lines and associated with row addresses $Y_1$ to $Y_n$;
    a load transistor associated with each column for connecting the drain regions of the column to a supply voltage $U_3$;
    decoding, logic and potential-selecting circuit means, disposed in at least one substrate well of the second conductivity type formed in the substrate body, responsive to binary code signals for assuming one of four operating modes corresponding to bitwise read (R), bitwise erase ($E_b$), bitwise write (W) and matrix-wise erase ($E_m$) and for providing an addressed word line with potentials of $U_R$, $U_0$, $U_3$ or $U_0$ respectively upon assuming the previously mentioned operating modes, for providing an addressed substrate region with potentials of $U_0$, $U_3$, $U_0$ or $U_3$ respectively upon assuming the previously mentioned operating modes, for providing all non-addressed word lines with potentials of $U_0$, $U_2$, $U_a$ or $U_0$, respectively upon assuming the previously mentioned operating modes, and for providing all non-addressed substrate regions with potentials of $U_b$, $U_1$, $U_c$ or $U_3$ respectively upon assuming the previously mentioned operating modes, wherein $U_3 - U_0$ approximately equals a gate voltage sufficient for shifting the field-effect threshold voltage of the DDC transistors and wherein $U_1 - U_0$ approximately equals $(U_3 - U_0)/3$, $U_2 - U_0$ approximately equals $(2(U_3 - U_0)/3)$, $U_R - U_0$ is no greater than $U_1 - U_0$, $U_a - U_0$ is no greater than $U_1 - U_0$, $U_b - U_0$ is no greater than $U_1 - U_0$, and $U_c - U_0$ is no greater than $U_2 - U_0$.

2. A monolithically integrated dual-dielectric cell (DDC) memory array according to claim 1 wherein each individual word line of the storage matrix receives its respective potential from the output of an associated potential selecting means, which potential selecting means is responsive to one of three inputs $A_y$, $B_y$ and $C_y$ from an associated word logic circuit for providing potentials of $U_2$, $U'_1$, or $U_0$ respectively to the word lines when the respective input receives a logic "1" and the two other inputs simultaneously receive a logic "0", and wherein the potential $U_3$ is switched to the word lines when all three inputs are simultaneously at a logic "0" and for switching potential $U'_1$ to one of potentials $U_1$ and $U_R$.

3. A monolithically integrated dual-dielectric cell (DDC) memory array according to claim 2 wherein the substrate body is coupled to potential $U_3$.

4. A monolithically integrated dual-dielectric cell (DDC) memory array according to claim 2 wherein the substrate body is always switched to the potential $U_3$ when the operating modes "bitwise erase" and "matrix-wise erase" have been assumed, the substrate body otherwise having potential $U_2$ applied thereto.

5. A monolithically integrated dual-dielectric cell (DDC) memory array according to claim 4 further including a combining-separating circuit means for switching potential $U'_1$ to potential $U_R$ when the operating mode "bitwise read" has been assumed and during all other modes to potential $U_1$.

6. A monolithically integrated dual-dielectric cell (DDC) memory array according to claim 5 additionally including a decoding means for producing control signals for three of the four possible operating modes from two binary input code signals $M_1$ and $M_2$ in accordance with the following relations:

$R = \overline{M}_1 \overline{M}_2 = \overline{M_1 + M_2}$, $E_b = \overline{M}_1 M_2 = \overline{M_1 + \overline{M}_2}$, $W = M_1 \overline{M}_2 = \overline{\overline{M}_1 + M_2}$, and $E_m = M_1 M_2 = \overline{\overline{M}_1 + \overline{M}_2}$, wherein R = bitwise read, $E_b$ = bitwise erase, W = bitwise write and $E_m$ = matrix-wise erase.

7. A monolithically integrated dual-dielectric cell (DDC) memory array according to claim 6 wherein R, $E_b$ and W are produced by said decoding means wherein $U_a = U_1$, $A_y = \overline{Y + \overline{E}_b}$, $B_y = \overline{YR} + \overline{yw} + M_2 = \overline{YM_1} + \overline{ym_1} + M_2$, and $C_y + \overline{YM_2} + W + A_y$ where Y indicates the address signal of the addressed word line.

8. A monolithically integrated dual-dielectric cell (DDC) memory array according to claim 7, wherein each individual substrate region of the storage matrix receives its respective potential from the output of an associated potential selecting means, which potential selecting means is responsive to three inputs $A_x$, $B_x$ or $C_x$ from an associated column logic circuit for providing potentials of $U_2$, $U'_1$ or $U_0$ respectively to the substrate region when the respective input receives a logic "1" and the two other inputs receive a logic "0", and wherein the potential $U_3$ is switched to the substrate region when all three of the inputs are simultaneously at a logic "0".

9. A monolithically integrated dual-dielectric cell (DDC) memory array according to claim 8 wherein $U_b = U_0$ $U_c = U_2$ $A_x = \overline{X + \overline{W}}$,
$B_x = \overline{X + \overline{E}_b}$
$C_x = \overline{\overline{X}M_1 + M_2}$ wherein X indicates the address signal of the addressed column.

10. A monolithically integrated dual-dielectric cell (DDC) memory array according to claim 8 wherein $U_b = U_R$ $U_c = U_2$ $A_x = \overline{X + \overline{W}}$ $B_x = \overline{X + \overline{M}_1}$ $C_x = \overline{X + \overline{M}_2}$ wherein X indicates the address signal of the addressed column.

11. A monolithically integrated dual-dielectric cell (DCC) according to claim 6 wherein R, $E_b$ and W are produced by said decoding means wherein $U_a = U_b = U_c = U_0$ $A_y = \overline{Y + \overline{E}_b}$ $B_y = \overline{\overline{Y} + \overline{R}}$ $C_y = \overline{Y\overline{M}_2 + A_y}$ wherein Y indicates the address signal of the addressed word line.

12. A monolithically integrated dual-dielectric cell (DDC) according to claim 11 wherein each individual substrate region of the storage matrix receives an respective potential from its associated potential selecting means wherein $C_x$ is firmly connected to the inverted code signal $M_2$ while $B_x$ is at the same time an output of the associated column logic circuit, wherein potential $U_1$ is switched to the associated substrate region when B = 1 and $C_x = M_2 = 0$, the potential $U_0$ being switched to the associated substrate region when $B_x = 0$ and $C_x = M_2 = 1$, and with the potential $U_3$ being switched to the associated substrate region when $B_x = C_x = 0$.

13. A monolithically integrated dual-dielectric cell (DDC) according to claim 12 wherein $B_x$ satisfies the following relationship $B_x = \overline{X + \overline{\overline{E}}_b}$ wherein X indicates the address signal of the addressed column.

14. A monolithically integrated dual-dielectric cell (DDC) according to claim 13 wherein the bit line of each column of the matrix is coupled to the output of a gate circuit via a switching transistor having a gate electrode which receives a signal for driving the switching transistor when the Y-address belonging to the respective column has been selected and when operating modes "bitwise read" and "bitwise write" have been selected.

* * * * *